United States Patent [19]

Kataoka et al.

[11] Patent Number: 5,361,122
[45] Date of Patent: Nov. 1, 1994

[54] AUTOFOCUSING DEVICE AND PROJECTION EXPOSURE APPARATUS WITH THE SAME

[75] Inventors: Yoshiharu Kataoka, Yokohama; Akiyoshi Suzuki, Tokyo; Yuichi Yamada, Kawasaki, all of Japan

[73] Assignee: Canon Kabushiki Kaisha, Tokyo, Japan

[21] Appl. No.: 11,097

[22] Filed: Jan. 29, 1993

Related U.S. Application Data

[63] Continuation of Ser. No. 919,385, Jul. 29, 1992, abandoned, which is a continuation of Ser. No. 851,108, Mar. 16, 1992, abandoned, which is a continuation of Ser. No. 755,481, Sep. 5, 1991, abandoned.

[30] Foreign Application Priority Data

Sep. 6, 1990 [JP] Japan .................................. 2-237900

[51] Int. Cl.⁵ ............................................. G03B 27/42
[52] U.S. Cl. .................................. 355/53; 355/43; 355/57; 355/77
[58] Field of Search ................ 355/53, 77, 43, 56, 355/57; 354/400, 406; 356/401; 250/548

[56] References Cited

U.S. PATENT DOCUMENTS

| | | | |
|---|---|---|---|
| 4,527,053 | 7/1985 | Kinoshita et al. | 354/406 X |
| 4,540,277 | 9/1985 | Mayer et al. | 355/53 |
| 4,592,650 | 6/1986 | Tabarelli et al. | 355/53 |
| 4,668,077 | 5/1987 | Tanaka | 355/43 X |
| 4,687,322 | 8/1987 | Tanimoto et al. | 355/53 X |
| 4,688,932 | 8/1987 | Suzuki | 355/51 |
| 4,704,020 | 11/1987 | Murakami et al. | 355/53 X |
| 4,737,823 | 4/1988 | Bouwer et al. | 355/53 |
| 4,780,615 | 10/1988 | Suzuki | 250/548 |
| 4,794,648 | 12/1988 | Ayata et al. | 382/8 |
| 4,801,977 | 1/1989 | Ishizaka et al. | 355/53 X |
| 4,803,524 | 2/1989 | Ohno et al. | 356/401 X |
| 4,814,829 | 3/1989 | Kosugi et al. | 355/43 |
| 4,853,745 | 8/1989 | Kamiya et al. | 356/401 X |
| 4,874,954 | 10/1989 | Takahashi et al. | 250/548 |
| 4,875,076 | 10/1989 | Torigoe et al. | 355/53 |
| 4,888,614 | 12/1989 | Suzuki et al. | 355/43 |
| 4,952,970 | 8/1990 | Suzuki et al. | 355/43 |
| 4,999,669 | 3/1991 | Sakamoto et al. | 355/53 |
| 5,008,705 | 4/1991 | Sindledecker | 355/43 |
| 5,117,254 | 5/1992 | Kawashima et al. | 355/43 |
| 5,137,349 | 8/1992 | Taniguchi et al. | 355/53 X |

FOREIGN PATENT DOCUMENTS

| | | |
|---|---|---|
| 269471 | 6/1989 | Germany . |
| 61-48923 | 3/1986 | Japan . |
| 61-196532 | 8/1986 | Japan . |
| 63-306626 | 12/1988 | Japan . |

*Primary Examiner*—Richard A. Wintercorn
*Attorney, Agent, or Firm*—Fitzpatrick, Cella, Harper & Scinto

[57] ABSTRACT

A focusing method is disclosed wherein a substrate is moved substantially along a focal plane of a projection optical system up to a predetermined station adjacent to the focal plane of the projection optical system and then, at the predetermined station, the surface of the substrate is brought into substantial coincidence with the focal plane of the projection optical system. The method includes the steps of detecting a deviation of the surface of the substrate with respect to the focal plane of the projection optical system, before the substrate, being moved substantially along the focal plane of the projection optical system, is moved up to the predetermined station; and substantially correcting the deviation on the basis of the detection.

17 Claims, 5 Drawing Sheets

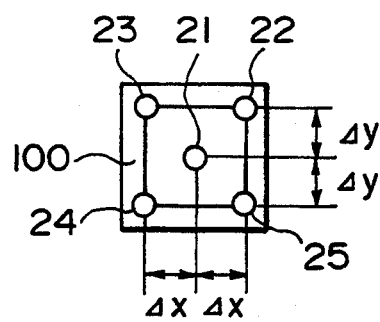
F I G. 2
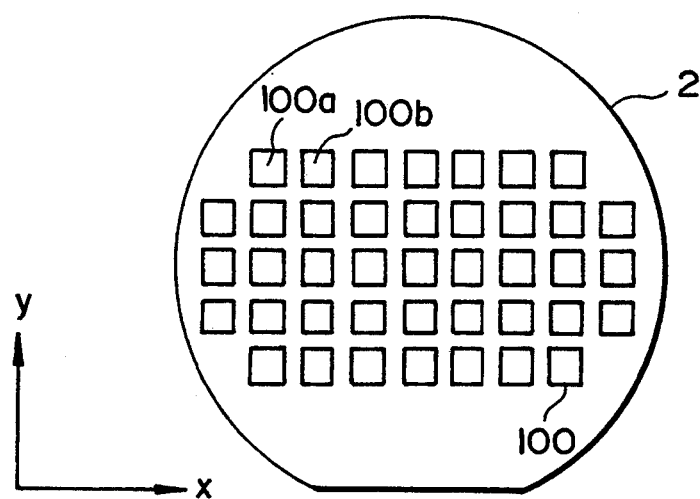
F I G. 3

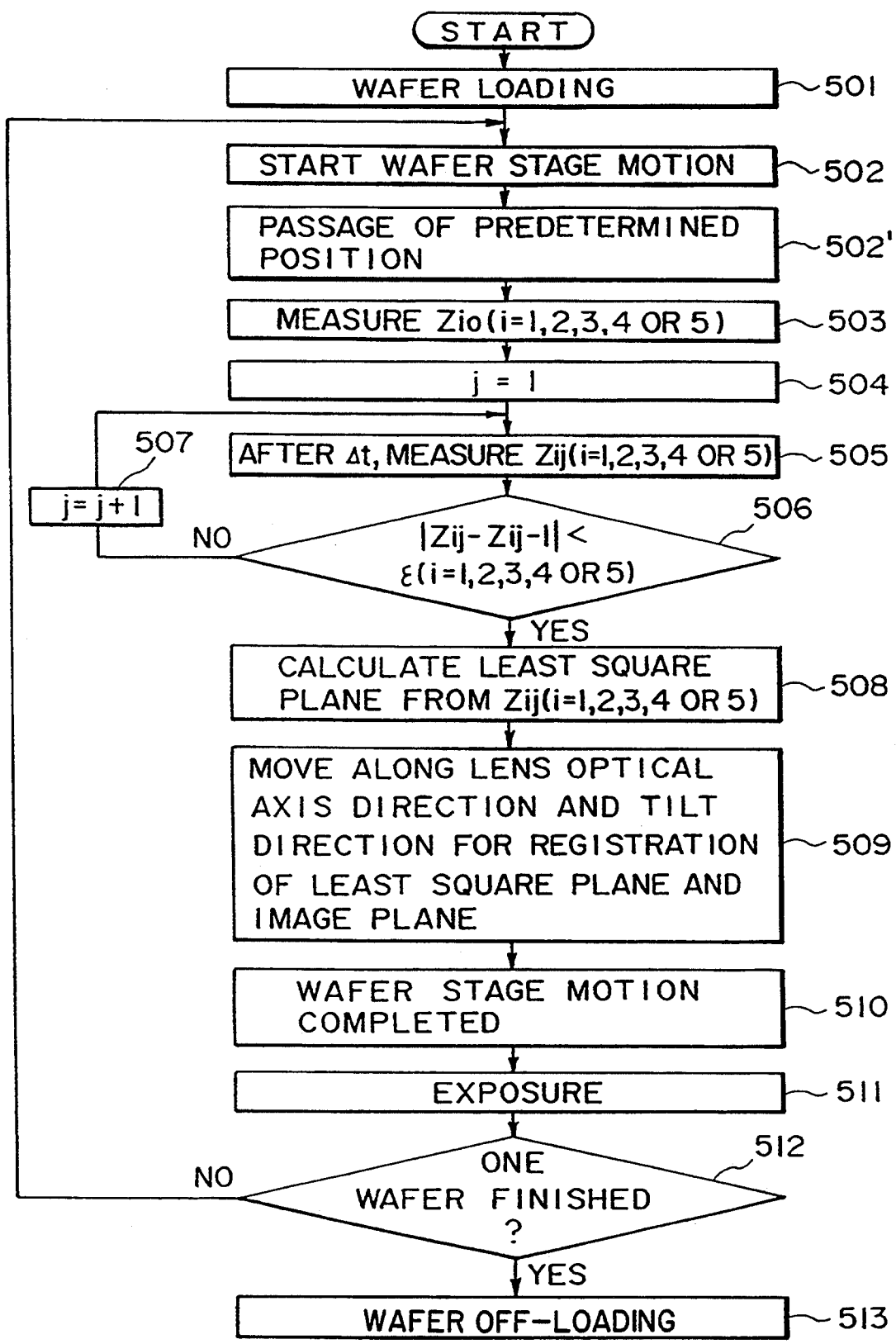
F I G. 5

AUTOFOCUSING DEVICE AND PROJECTION EXPOSURE APPARATUS WITH THE SAME

This application is a continuation of prior application, Ser. No. 07/919,385 filed Jul. 29, 1992, which application is a continuation of prior application, Ser. No. 07/851,108 filed Mar. 16, 1992, which application is a continuation of prior application, Ser. No. 07/755,481 filed Sep. 5, 1991, all now abandoned.

FIELD OF THE INVENTION AND RELATED ART

This invention relates to an autofocusing device and a projection exposure apparatus with the same. More particularly, the invention in one aspect is concerned with an autofocusing device for bringing different portions of a substrate sequentially into focus with a focal plane of a projection optical system. In another aspect, the invention is concerned with a semiconductor device manufacturing reduction projection exposure apparatus (called a "stepper") for placing, sequentially, different exposure areas (pattern forming areas) of a semiconductor wafer, supported on a wafer stage, into coincidence with a focal plane of a projection optical system such as a reduction projection lens system and then for printing an image of a circuit pattern of a reticle (original) onto each exposure area of the wafer.

Enlarging of the numerical aperture (NA) of a reduction projection lens system of a stepper required by further increases in the degree of integration of a very large scaled integrated circuit (VLSI) and consequent further miniaturization of a circuit pattern to be printed, has forced a reduction of the depth of focus of the lens system in the pattern transfer process. Also, it has forced enlargement of the size of an exposure area to be exposed by the reduction projection lens system.

This necessitates assured positioning of each exposure area (shot area) of a wafer, as a whole, correctly within the depth of focus of a reduction projection lens system, for assured transfer of a circuit pattern onto the exposure area as a whole which is large in size.

To this end, it is important to detect the position or inclination of the surface of a wafer with respect to a focal plane of a reduction projection lens system (i.e. a plane on which an image of a circuit pattern of a reticle is focused) very precisely and, also, to adjust the position or inclination of the wafer surface correctly.

As for a method of detecting the wafer surface position in a stepper, there is a method wherein air microsensors are used to detect levels at different locations on the surface of a wafer and, based on this detection, the surface position of the wafer is determined. Also, there is a method wherein a detection optical system is used to project light obliquely onto the surface of a wafer and any positional deviation of the reflection point on the wafer surface is detected by detecting a shift of the position of reflected light incident on a sensor, whereby the position of the wafer surface is determined.

In any case, for the autofocusing operation in a stepper, a wafer stage is moved by a servo controlled drive to a target position with its displacement being measured through laser interferometer means, to thereby move an exposure area of a wafer up to a station just underneath a projection lens system. After the wafer stage stops, the surface position of that exposure area is measured in the manner as described above and, then, the position of that exposure area is adjusted. Namely, the autofocusing operation includes sequential steps of wafer stage drive, wafer stage stop, surface position detection and surface position adjustment. This requires a relatively long time to complete the focusing of each exposure area with respect to the focal plane of the projection lens system and thus causes reduced throughput of the exposure apparatus.

SUMMARY OF THE INVENTION

It is accordingly a primary object of the present invention to provide an improved autofocusing method or device with which the autofocusing operation can be accomplished in a reduced time.

It is another object of the present invention to provide a projection exposure apparatus with such an autofocusing device.

Briefly, in accordance with one aspect of the present invention, there is provided a focusing method wherein a substrate is moved substantially along a focal plane of a projection optical system up to a predetermined station adjacent to the focal plane of the projection optical system and then, at the predetermined station, the surface of the substrate is brought into substantial coincidence with the focal plane of the projection optical system, the improvements residing in the steps of: detecting a deviation of the surface of the substrate with respect to the focal plane of the projection optical system, before the substrate, being moved substantially along the focal plane of the projection optical system, is moved up to the predetermined station; and substantially correcting the deviation on the basis of the detection.

In accordance with another aspect of the present invention, there is provided a semiconductor device manufacturing method wherein a wafer is moved substantially along a focal plane of a projection optical system to place different portions of the wafer sequentially at a predetermined station, adjacent to the focal plane of the projection optical system, and wherein, at the predetermined station, each portion of the wafer is brought into substantial coincidence with the focal plane of the projection optical system and then a radiation beam is projected to that portion of the wafer through the projection optical system to print a pattern on that portion of the wafer, the improvements residing in the steps of: detecting a deviation of the surface of a particular portion of the wafer with respect to the focal plane of the projection optical system, before the particular portion of the wafer, being moved substantially along the focal plane of the projection optical system, is moved up to the predetermined station; and substantially correcting the deviation on the basis of the detection.

In accordance with a further aspect of the present invention, there is provided a semiconductor device manufacturing method wherein a wafer is moved substantially along a focal plane of a projection optical system to place different portions of the wafer sequentially at a predetermined station, adjacent to the focal plane of the projection optical system, and wherein, at the predetermined station, each portion of the wafer is brought into substantial coincidence with the focal plane of the projection optical system and then a radiation beam is projected to that portion of the wafer through the projection optical system to print a pattern on that portion of the wafer, the improvements residing in the steps of: detecting a deviation of the surface of a particular portion of the wafer with respect to the focal plane of the projection optical system, before the particular portion of the wafer, being moved, is moved up to the predetermined station; and moving the wafer along an optical axis of the projection optical system in accordance with the detection of the deviation so as to substantially correct the deviation.

In accordance with a still further aspect of the present invention, there is provided an autofocusing device for bringing a surface of a substrate, placed at a predetermined station, into focus with a focal plane of a projection optical system, said device comprising: a holder for holding the substrate and being movable substantially along the focal plane of said projection optical system so as to move the substrate to said predetermined station; a detecting system for detecting a deviation of the surface of the substrate with respect to the focal plane, said detecting system being adapted to detect the position of the surface of the substrate during movement of said holder substantially along the focal plane of said projection optical system and before the substrate, being moved by said holder, is moved up to said predetermined station; and an adjusting system for adjusting a positional relationship between the focal plane of said projection optical system and the surface of the substrate on the basis of the detection by said detecting system, so as to bring the focal plane of said projection optical system and the surface of the substrate into substantial coincidence with each other.

In accordance with yet a further object of the present invention, there is provided a step-and-repeat exposure apparatus with a projection optical system, for placing different portions of a wafer sequentially at a predetermined station, adjacent to a focal plane of said projection optical system, and for projecting a radiation beam to each portion of the wafer, placed at said predetermined station, through said projection optical system to thereby print a pattern on that portion of the wafer, said apparatus comprising: a wafer stage for holding the wafer and being movable substantially along the focal plane of said projection optical system so as to move each portion of the wafer to said predetermined station, sequentially; a detecting device for detecting a deviation of a surface of a particular portion of the wafer with respect to the focal plane of said projection optical system, said detecting device being adapted to detect the position of the surface of the particular portion of the wafer during movement of said wafer stage substantially along the focal plane of said projection optical system and before the particular portion of the substrate, being moved by said wafer stage, is moved up to said predetermined station; and an adjusting device for adjusting a positional relationship between the focal plane of said projection optical system and the surface of the particular portion of the substrate on the basis of the detection by said detecting device, so as to bring the focal plane of said projection optical system and the surface of the particular portion of the substrate into substantial coincidence with each other.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 illustrates the points on an exposure area which might be irradiated with light beams from a detection optical system when the exposure area is positioned at the exposure station.

FIG. 3 is a plan view showing the layout of exposure areas (shot areas) on a wafer.

FIG. 5 is a flow chart showing an example of an autofocusing operation to be executed with the device of FIG. 1.

DESCRIPTION OF THE PREFERRED EMBODIMENTS

Figure 1:
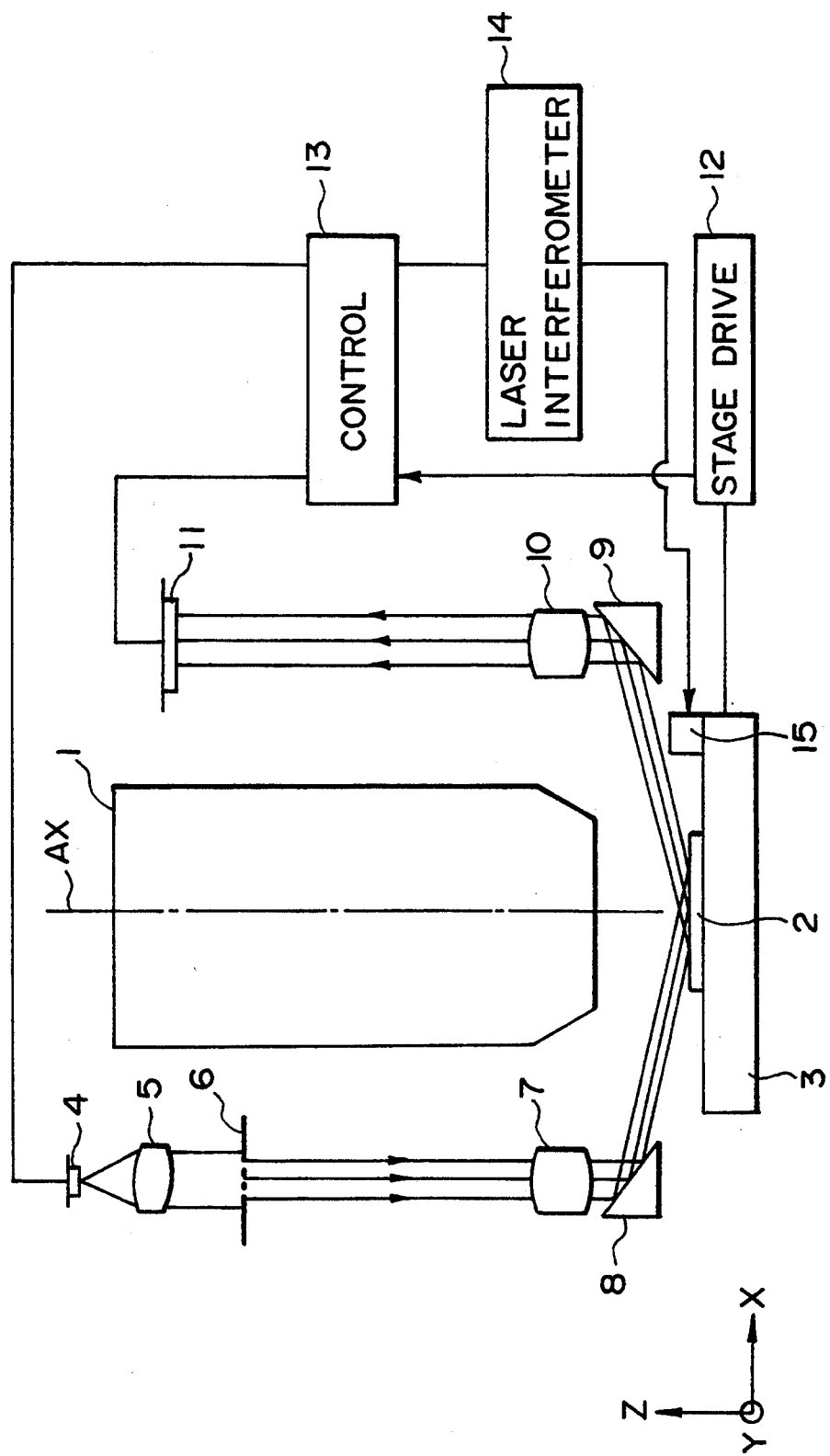
FIG. 1 is a schematic view of a main portion of a reduction projection exposure apparatus into which the present invention is incorporated.

An autofocusing device according to one aspect of the present invention may be so arranged that: A stage for supporting a sheet-like object such as a wafer moves in a direction substantially orthogonal to an optical axis of a projection optical system, so as to move a particular surface portion of the object to an image plane of the projection optical system. A detector detects at least one of a position and inclination of the particular surface portion of the object with respect to the direction of the optical axis of the projection optical system. The detection through the detector is executed during the movement of the stage and, on the basis of this detection, the particular surface portion of the object is brought into focus with the focal plane of the projection optical system.

With this arrangement, the surface position detection can be executed before the stage, being moved, reaches and stops at a target position. As a result, for example, the adjustment of the surface position can be initiated during movement of the stage or just after the stage stops. This assures reduced time for the autofocusing operation and, when such an autofocusing device is incorporated into a stepper, it ensures enhanced throughput of the stepper.

For placing a particular surface portion of a sheet-like object in focus with the focal plane of a projection optical system on the basis of the detection by a detector, many methods are adoptable. An example is a method wherein a stage is moved along the optical axis of the projection optical system, to thereby adjust the position or inclination of the particular surface portion. Another example is a method wherein the projection optical system is displaced in the direction of the optical axis thereof or, alternatively, the focal length of the projection optical system is changed, to thereby shift the focal plane thereof. When the focal length (refracting power) of the projection optical system is to be changed, the wavelength of light to be used for the projection may be changed or, alternatively, one or more lenses of the projection optical system may be displaced along the optical axis. As a further alternative, an air chamber may be defined between a pair of lenses of the projection optical system and the pressure in that chamber may be changed.

The detector means is not limited to air sensor means. Optical sensor means, electrostatic capacitance sensor means, or any other type sensor means may be used. For detection of inclination of a particular surface of a sheet-like object such as a wafer, plural sensors such as air sensors or optical sensors may be used to execute level (surface position) measurement at different points on the particular surface. Alternatively, a parallel light may be projected onto the particular surface and the position of incidence of the parallel light, as reflected by the particular surface and converging on a photodetector, may be detected.

An autofocusing method or device of the present invention may be incorporated into any type of exposure apparatus using X-rays, an electron beam or any other short-wavelength radiation beam, for the pattern printing.

Referring now to FIG. 1 which is a schematic view of a main portion of a semiconductor device manufacturing reduction projection exposure apparatus into which an embodiment of the present invention is incorporated, denoted at 1 is a reduction projection lens system having an optical axis AX. The reduction projection lens system 1 serves to project a circuit pattern of a reticle (not shown) in a reduced scale of 1:5, and to form an image of the circuit pattern on its focal plane. In the drawing, the optical axis AX is held parallel to the Z axis illustrated. Denoted at 2 is a wafer having a surface coated with a resist. On the surface of the wafer 2, there are a number of arrayed exposure areas (shot areas) having the same patterns printed through the preceding exposure process or processes. Wafer stage 3 supports and holds the wafer 2 thereon by attraction. The wafer stage 3 comprises an X stage which is movable along an X axis, a Y stage which is movable along a Y axis, and a Z stage which is movable along the Z axis and is rotationally movable about each of the axes parallel to the X, Y and Z axes. The X and Y axes are orthogonal to each other. Thus, driving the wafer stage 3 can serve to adjust the position of the wafer 2 surface in a direction along the optical axis AX of the reduction lens system 1 and also in a direction along a plane perpendicular to the optical axis AX. Further, it can serve to adjust any inclination of the wafer 2 surface with respect to the focal plane of the projection lens system (i.e. the formed image of the circuit pattern).

Reference numerals 4–11 in FIG. 1 denote those elements of a detection optical system which is provided to detect the position and inclination of the wafer 2 surface. Denoted at 4 is a high-luminance light source such as a light emitting diode or a semiconductor laser, and denoted at 5 is an illumination lens. The light emanating from the light source 4 is transformed by the illumination lens into parallel light which impinges on a mask 6 having pinholes formed therein. Plural light beams passing through the pinholes of the mask 6 then pass through an imaging lens 7 and are incident on a deflection mirror 8. The light beams deflected by the mirror 7 are incident on the wafer 2 surface. Here, the imaging lens 7 and the deflection mirror 8 serve to form images of the pinholes on the wafer 2 surface. In this particular example, the incident light beams irradiate five locations on an exposure area 100 of the wafer 2, and they are reflected at these locations, respectively. Namely, in this particular example, the mask 6 has five pinholes and, at five measuring points in each exposure area 100, the surface position is measured.

The light beams reflected at the measuring points on the wafer 2, respectively, are deflected by another deflection mirror 9 and, after passing through a detection lens 10, they are incident on a two-dimensional (area) position detecting device 11. Here, the detection lens 10 cooperates with the imaging lens 7, the deflection mirror 8, the wafer 2 and the deflection mirror 9 to form images of the pinholes of the mask 6 on the position detecting device 11. Thus, it can be stated that the mask 6, the wafer 2 and the position detecting device 11 are in an optically conjugate relationship with each other.

The position detecting device 11 may comprise a CCD array, and it serves to detect the position of incidence of each light beam upon the light receiving surface of the detecting device 11, independently of the others. Since a change in position of the wafer 2 in the direction along the optical axis AX of the projection lens system 1 can be detected as a deviation of the position of incidence of each light beam on the position detecting device 11, the position of the wafer 2 surface in the direction of the optical axis AX, at each of the five measuring points in the exposure area 100 on the wafer 2 can be detected on the basis of the output signals from the position detecting device 11. The output signals of the position detecting device are applied to a control device 13 through a signal line.

Displacement of the wafer stage 3 in each of the X axis and the Y axis can be measured in a well-known manner by using a reference mirror 15 and a laser interferometer 14, and a signal representing the displacement of the wafer stage 3 is applied to the control device 13 through a signal line. Also, the movement of the wafer stage 3 is controlled by means of a stage driving device 12. The stage driving device 12 receives an instruction signal from the control device 13 and, in response to which, it effects servo control of the wafer stage 3.

The stage driving device 12 includes first and second driving means. The first driving means serves to adjust the position (x, y) of the wafer 2 in a plane orthogonal to the optical axis AX and the rotation ($\theta$) of the same, while the second driving means serves to adjust the position (z) of the wafer 2 in the direction of the optical axis AX and the inclination ($\phi_{x,y}$) of the same.

The control device 13 serves to process the output signals (surface position data) from the position detecting device 11 in a manner to be described later, to determine the position of the wafer 2 surface. Also, on the basis of the result of the detection, it applies a corresponding signal to the stage driving device 12. In response to the applied signal, the second driving means of the stage driving device 12 operates to adjust the position of the wafer 2 with respect to the optical axis AX direction as well as the inclination of the same.

Initially, the detection optical system (4–11) of FIG. 1 is so set to assure that, when the stage 3 is moved to a certain target position and a particular exposure area (shot area) 100 of the wafer 2 is correctly aligned with the pattern of the reticle, the images of the pinholes of the mask 6 are projected on the points 21–25 in that exposure area as shown in FIG. 2. At this time, the particular exposure area 100 is positioned just underneath the projection lens system 1 (exposure station) and the point 21 is aligned with the optical axis AX. More specifically, as shown in FIG. 2, the five points 21–25 are set in an exposure area 100, and the point 21 is substantially at the center of the exposure area 100. The point 21 is coincident with the optical axis AX when the exposure is done. The remaining points 22–25 are in a peripheral portion of the exposure area 11. If the point 21 is set at a position (x, y) in an X-Y coordinate, then the remaining points 22–25 are at the positions as depicted by $(x+\Delta x, y+\Delta y)$, $(x-\Delta x, y+\Delta y)$, $(x-\Delta x, y-\Delta y)$ and $(x+\Delta x, y-\Delta y)$, respectively. As best seen in FIG. 3, all the exposure areas 11 are arrayed on the wafer 2 regularly, along the X and Y axes.

In this embodiment, the wafer stage 3 is so moved that a first exposure area 100a of the wafer 2 is moved to a position just underneath the projection lens system 1, and then the first exposure area 100 is aligned with the pattern of the reticle. Before the alignment operation is completed and when the wafer stage 3 is being moved, the detection optical system (4-11) is used to detect the surface positions at five points within the first exposure area 100 and, on the basis of the corresponding output signals from the position detecting device 11, the control means prepares the surface position data related to the five points. Here, each of the five points irradiated by the five light beams (pinhole images) is spaced from or in short of a corresponding one of the five points 21-25 (FIG. 2), with respect to the movement direction of the wafer stage 3, by a predetermined distance. Depending on this distance predetermined, for example, each light spot formed on the wafer may be separate from a corresponding one of the points 21-25 or it may partially overlap that point.

Then, on the basis of the five surface position data Zi (i=1 to 5), the control device 13 calculates a least square surface (or the position thereof) of the first exposure area 100a, and also calculates the interval between this least square surface and the image of the pattern of the reticle in the optical axis AX direction as well as the amount and direction of the inclination of the least square surface. Here, the position (z) of the least square surface is one that satisfies the following relation:

$$\sum_{i=1}^{5} (z - zi)^2 = 0$$

The control device 13 applies to the stage driving device 12 an instruction signal corresponding to the results of these calculations, and the stage driving device 12 operates to adjust (correct) the position in the optical axis AX direction and the inclination of the wafer 2 held on the wafer stage 3. This allows positioning of the wafer 2 surface, namely, the first exposure area 100a thereof, on the best imaging plane (focal plane) of the projection lens system 1, during movement of the wafer stage 3. After this, the movement of the wafer stage 3 to a corresponding target position (i.e. the position for placing the first exposure area 100a at the exposure station) is accomplished.

After such surface position adjustment and the wafer stage movement, the first exposure area 100a is exposed and the image of the pattern of the reticle is printed on this area.

After exposure of the first exposure area 100a, the wafer stage 3 is moved so as to move a second exposure area 100b of the wafer 2 to the position just underneath the projection lens system 1 and, in a similar manner as described above, the surface position detection and adjustment during movement of the wafer stage as well as the exposure operation after completion of the wafer stage movement are carried out. By repeating these operations, the circuit pattern of the reticle is printed on all the exposure areas, whereby one process for manufacture of semiconductor devices is completed.

Figure 4:
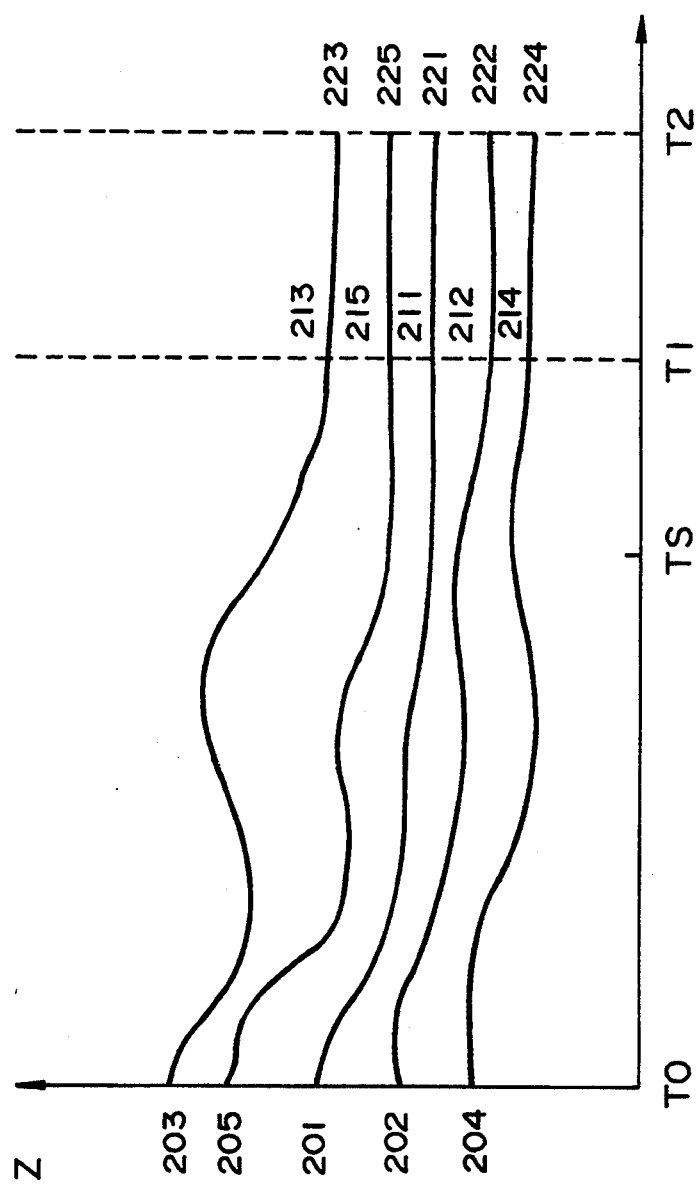
FIG. 4 is a graph for exemplifying surface levels measured at different measuring points, which levels change with the movement of a wafer stage.

FIG. 4 exemplarily shows output signals from the position detecting device 11 responsive to five light beams irradiating the wafer 2, as the wafer stage 3 is moved after the exposure of a first exposure area 100a to move a second exposure area 100b to the position just underneath the projection lens system 1.

At time $T_0$, the movement of the wafer stage 3 starts. The levels measured at the five points are $Z_{i0}$ (i=1 to 5). The detection optical system (4-11) continuously measures the surface shape of that portion of the wafer 2, from the first exposure area 100a to the second exposure area 100b, by using the five light beams. At time $T_1$, the center of the second exposure area 100b on the wafer 2 is positioned about 5 microns in short of or upstream of the exposure station under the projection lens system 1 (the position where the center of the exposure area 100b should be aligned with the optical axis AX). At time $T_2$, the second exposure area 100b is positioned just underneath the projection lens system 1, and the wafer stage 3 movement completes. At time Ts in the drawing, the center of the exposure area 100b is positioned 100 microns in short of the position aligned with the optical axis.

At time $T_1$, the five points irradiated by the five light beams are about 5 microns in short of the respective target positions (the points 21-25 on the exposure area 100b) and, as seen in the graph, from time $T_1$ to time $T_2$, the measured levels $Z_{i1}$ (i=1 to 5) related to the irradiated five points gradually converge to the levels $Z_{i2}$ (i=1 to 5) which are related to the points 21-25 as the wafer stage 3 movement just completes. If the position at time $T_1$ is set at 5 microns upstream of the exposure position, the measured levels $Z_{i1}$ at that position are approximately the same as the levels $Z_{i2}$, and thus they can be effectively used for the surface position adjustment to the exposure area which is just going to be exposed.

In this embodiment of the present invention, particular notice has been paid to the "continuity" of attitude in the movement as shown in FIG. 4 until the completion of the wafer stage 3 movement. Just before the moving wafer stage 3 reaches its target position, the attitude thereof is approximately the same as that to be taken as the stage 3 is stopped and, by utilizing such phenomenon, the surface position measurement is executed during movement of the wafer stage 3.

In this particular example, the measurement to each exposure area 100 through the detection optical system (4-11) is executed while the wafer stage 3 is being moved and at time $T_1$ whereat the wafer stage 3 just passes a position 5 microns distant from or in short of a corresponding target position, and, on the basis of the levels $Z_{i1}$ (i=1 to 5) measured in relation to the five points at that time, the position of a least square surface of that exposure area 100 as well as the amount and direction of inclination of that exposure area, with respect to the focal plane of the projection lens system 1, are determined. Therefore, as compared with a case when the measurement starts at time $T_2$ as the wafer stage 3 movement just completes, reduction of time by $(T_2 - T_1)$ is assured.

Also, in this particular example, the adjustment of the surface position and inclination of each exposure area 100 starts when the wafer stage 3 is moving, and this adjustment is accomplished before the wafer stage 3 movement finishes. With this focusing operation of this example, it is possible to increase the throughput of the apparatus largely.

Further examples of autofocusing operations using the structure shown in FIG. 1 will now be explained in conjunction with the flow charts of FIGS. 5 and 6. It should be noted here that the operations according to these example can be done only with small modification of a program to be set in the control device 14.

The sequence shown in the flow chart of FIG. 5 will be first explained.

At step 501, a wafer 2 is loaded on the wafer stage 3, and the wafer 2 is held fixed on a chuck of the Z stage of the wafer stage 3. At step 502, the drive of the wafer stage 3 starts, and the wafer stage 3 starts its movement toward a target position to place a first exposure area of the wafer 2 at a position just below the projection lens system 1. At step 502', the wafer stage 3 passes a predetermined position (time Ts position in FIG. 4) which is a predetermined distance (e.g. 100 microns) in short of the target position. The position of the wafer stage 3 is monitored on the basis of the output of the laser interferometer 14. At this time, as specified at step 503, surface position measurement is done to five measuring points by using the detection optical system (4–11), and measured levels $Z_{i0}$ obtained thereby are memorized into a memory of the control device 13. Also, as specified at step 504, the control device 13 resets its counter to a value of j=1 and, in response to this, at step 505 the detection optical system (4–11) measures the surface positions at five points on the moving wafer 2 at the moment of time "Ts+$\Delta$t". The levels $Z_{i1}$ (i=1 to 5) obtained by the measurement are memorized into the memory of the control device 13.

Then, at step 506, discrimination is made as to whether the difference of each level $Z_{i1}$ (i=1 to 5) measured a second time from each corresponding level $Z_{i0}$ (i=1 to 5) measured first time (namely, $\Delta_1=Z_{11}-Z_{10}$; $\Delta_2=Z_{21}-Z_{20}$; $\Delta_3=Z_{31}-Z_{30}$; $\Delta_4=Z_{41}-Z_{40}$; and $\Delta_5=Z_{51}-Z_{50}$), is greater than a predetermined amount $\epsilon$ or not. If all the differences $\Delta i$ (i=1 to 5) are equal to or smaller than $\epsilon$, the second time measured levels $Z_{i1}$ (i=1 to 5) are taken as effective, and the sequence goes to step 508. If at least one of the differences $\Delta i$ (i=1 to 5) related to the five measuring points is larger than $\epsilon$, the sequence goes to step 507 where the counter of the control device 13 is incremented to j=2 and then the measurement at step 505 is repeated. Until all the differences i (i=1 to 5) become equal to or smaller than $\epsilon$, the operations at steps 505–507 are repeated.

The effective measured levels $Z_{ij}$ (i=1 to 5) are used at step 508 to calculate a least square plane. Then, the spacing of this least square plane from the focal plane of the projection lens system 1 as well as the amount and direction of inclination of the first exposure area are determined. The control device 13 applies an instruction signal, corresponding to the spacing and the amount and direction of inclination as determined, to the stage driving device 12. At step 509, the stage driving device 12 moves the Z stage to correct the position and inclination of the wafer 2 with respect to the optical axis AX direction.

After this, at step 511, the wafer stage 3 reaches its target position and thus the wafer stage 3 movement completes. At this time, through the output of the laser interferometer 14, the control device 13 detects the arrival of the wafer stage 13 at its target position and then it controls the exposure apparatus so as to start the exposure operation at step 511. At this step 511, the first exposure area of the wafer 2 is exposed to an image of a circuit pattern with radiation, and thus the circuit pattern is transferred onto a resist on this exposure area.

Then, at step 512, discrimination is made as to whether exposures of all the exposure areas on the wafer 2 have been accomplished. If accomplished, the sequence goes to step 513 and the wafer is off-loaded. If, on the other hand, all the exposures have not been accomplished (step 512) and there remains any exposure area which is unexposed, the sequence goes back to step 502 and the wafer stage 3 is driven again so as to place a second exposure area, for example, at the position just below the projection lens system 1. In this manner, the operations at steps 501–512 are repeated until exposures of all the exposure areas are accomplished.

Next, the sequence shown in the flow chart of FIG. 6 will be explained.

Figure 6:
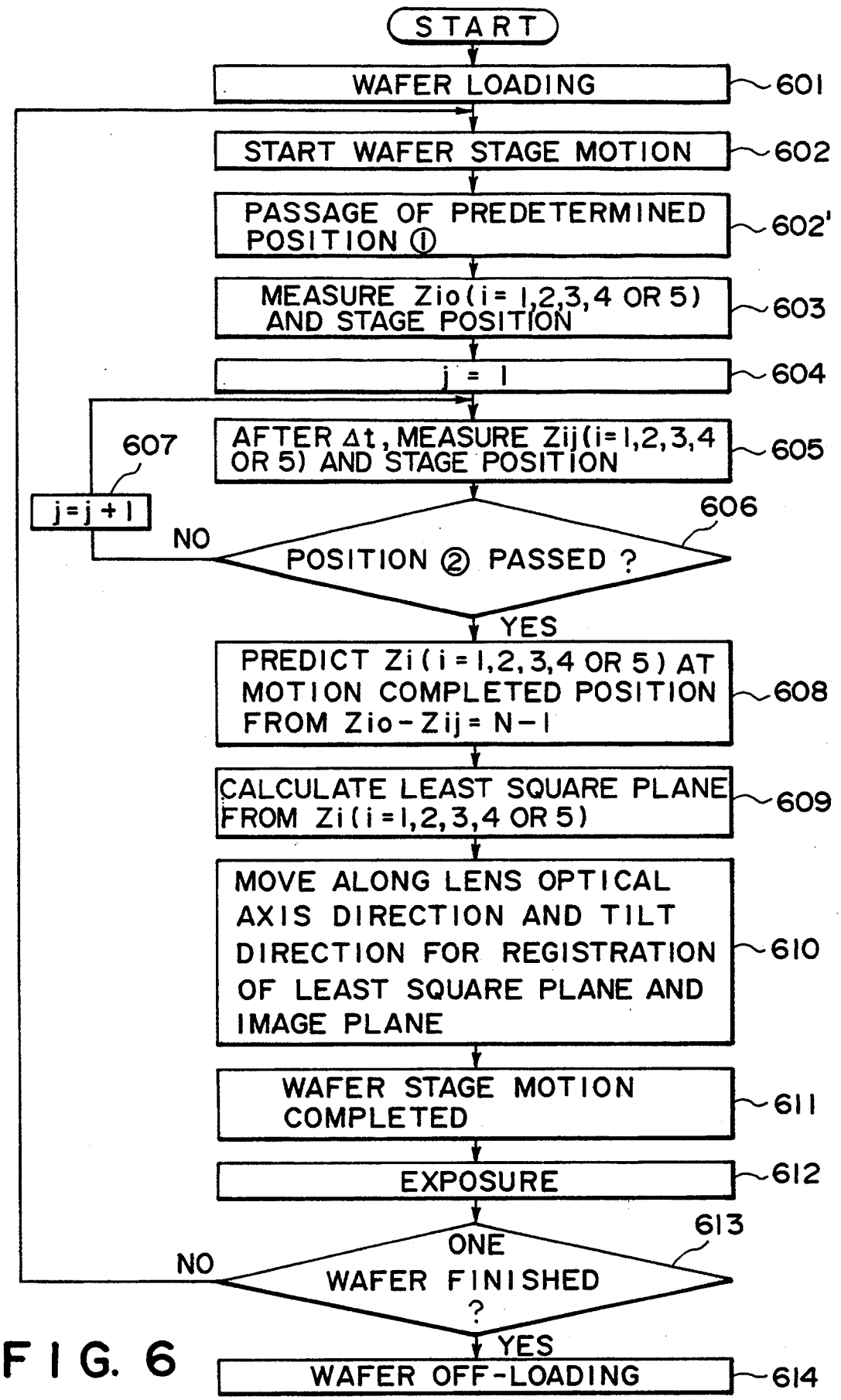
FIG. 6 is a flow chart showing another example of an autofocusing operation to be executed with the device of FIG. 1.

In FIG. 6, steps 601 and 602 are similar to steps 501 and 502 in FIG. 5, and steps 610–614 are similar to steps 509–513 in FIG. 5. Thus, explanation of these steps will be omitted, and only steps 602'–609 will now be explained.

In FIG. 6, a first predetermined position (1) in step 602' is set at such a position that, from the surface precision of a wafer 2 or the action (such as a change in attitude) of the moving wafer stage 3, it is predicted that in the movement of the wafer stage 3 from that position to a target position a certain linear relation is substantially retained in the measured levels sequentially obtained from the detection optical system (4–11). Also, a second predetermined position (2) is set at such a position that the calculation of a least square plane at step 608 and the focusing operation at step 610 can be accomplished before the movement of the wafer stage 3 completes at step 611.

When in operation the wafer stage 3 passes the predetermined position (1) at step 602', the surface positions at five measuring points are measured (step 603) through the detection optical system (4–11), and the levels $Z_{i0}$ (i=1 to 5) obtained by the measurement are memorized into a memory of the control device 13. Simultaneously, the control device 13 detects the position of the wafer stage 3 on the basis of the output of the laser interferometer 14, and stores the corresponding data into the memory.

Then, at step 604, the control device 13 resets its counter to j=1 and, in response to this and at the position corresponding to time $\Delta$t from the time as step 602 has been executed, the detection optical system (4–11) effects the surface position measurement to five points. The obtained levels are memorized into the memory of the control device 13. Concurrently, the position of the wafer stage at this time is detected and the corresponding data is stored into the memory.

At step 606, whether the wafer stage 3 has passed the second predetermined position (2) is discriminated on the basis of the output of the laser interferometer 14. If not yet passed, the sequence goes to step 607 whereby the measurement at step 605 is repeated. In this manner, during the movement of the wafer stage 3 from the first predetermined position (1) to the second predetermined position (2), the surface position measurement and the stage position measurement are effected by N times, using the detection optical system (4–11), whereby N sets of measured levels $Z_{ij}$ (i=1–5) are obtained. If at step 606 the passage of the wafer stage 3 through the second predetermined position (2) is discriminated, then at step 608 the N sets of measured levels $Z_{i0}$ to $Z_{ij}$ (i=1 to 5 and j=N−1) and the positional data of a number N, as stored in the memory, are used to predict the levels $Z_i$ (i=1 to 5) to be measured as the wafer stage movement completes. This prediction is made on the basis of numerical calculations which are equivalent to those for obtaining, by extrapolation, the levels $Z_i$ (i=1 to 5) of the surface position at the target position, from a straight line (linear function) or a curved line (quadratic function) as can be drawn by plotting the positional data of a number N and the N sets of measured levels, while taking the positional coordinate of the stage on the axis of abscissa and taking the measured level of the surface position on the axis of ordinate. Then, at step 609, the least square surface of the exposure area of the wafer 2 is calculated on the basis of the predicted levels $Z_i$ (i=1 to 5).

In the sequences described with reference to FIGS. 5 and 6, whether or not an instruction signal is to be applied to the stage driving device 12 for execution of the step 509 or 610, may be discriminated on the basis of five measured levels as obtainable from the detection optical system (4–11) at a certain time such as time T1, namely, at the position 5 microns in short of the target position. If this is done, then it is easily possible to take appropriate measures to a large change, if any, in the surface position of the exposure area which may occur just before the wafer stage 4 completes its movement. More specifically, if the surface position as represented by the five measured levels at that position has a very small deviation from the least square surface as determined in the earlier step, an instruction signal based on the earlier step may be applied to the stage driving device 12. If the surface position as represented by the five measured levels has a non-negligible deviation from the least square surface as calculated in the earlier step, such an instruction signal that corresponds to the spacing between the least square surface as calculated from these five measured levels and the focal plane of the projection lens system 1 as well as the amount and direction of inclination of the exposure area, may be applied to the stage driving device 12.

In the examples described in the foregoing, preferably the detection optical system (4–11) may be continuously operated until the exposure operation is executed so as to continuously monitor the surface position of the exposure area which is the subject of the exposure at that time.

While in the above-described examples the position and inclination of the surface of a wafer 2 are detected and corrected, as a matter of course, the present invention is applicable to a device by which only the position of a wafer 2 is to be detected and corrected or a device by which only the inclination of the surface of a wafer 2 is to be detected and corrected. Further, the detecting means for detecting the surface position or inclination of the wafer 2 surface is not limited to such a detection optical system (4–11) as shown in FIG. 1. Any other type of detecting means known in the art may be used. Also, the mechanism for bringing the wafer 2 surface into focus with the focal plane of the projection lens system is not limited to the one for moving the Z stage of the wafer stage 3. A mechanism for changing the focal length of the projection lens system 1 or for moving the projection lens system 1 and the reticle (not shown) upwardly or downwardly along the optical axis AX, may be used.

While in the foregoing examples the invention is applied to a reduction projection exposure apparatus, the present invention is applicable also to other types of exposure apparatuses such as, for example, an apparatus for projecting an image of a pattern by using a projection mirror system or a projection optical system having lens and mirror optical systems. Additionally, the present invention is applicable also to exposure apparatuses other than optical exposure apparatuses, examples of which are an electron beam exposure apparatus wherein an electron beam is used in combination with electron lenses to project or directly draw a circuit pattern on a wafer, or an X-ray exposure apparatus using X-rays.

It is also to be noted that the present invention is not limited to such an exposure apparatus but is applicable to an optical instrument wherein high-speed and accurate autofocusing is desired.

In accordance with the above-described embodiments of the present invention, the position or inclination of a moving plate-like object such as a wafer is detected during movement of a stage which supports the object. As a result, it is possible to reduce the time for the autofocusing operation. Also, when the adjustment of the position or inclination of the surface of the object is done during the movement of the stage, further reduction in time of the focusing operation is assured.

While the invention has been described with reference to the structures disclosed herein, it is not confined to the details set forth and this application is intended to cover such modifications or changes as may come within the purposes of the improvements or the scope of the following claims.

What is claimed is:

1. An autofocusing device for bringing a surface of a substrate, placed at a predetermined station, into focus with a focal plane of a projection optical system, said device comprising:

a holder for holding the substrate and being movable substantially along the focal plane of said projection optical system so as to move the substrate to said predetermined station, wherein said holder displaces the substrate along an optical axis of said projection optical system;

a detecting system for detecting a deviation of the surface of the substrate with respect to the focal plane, said detecting system detecting the position of the surface of the substrate during movement of said holder substantially along the focal plane of said projection optical system and before the substrate, being moved by said holder, is moved up to said predetermined station; and an adjusting system for adjusting a positional relationship between the focal plane of the substrate on the basis of the detection by said detecting system, so as to bring the focal plane of said projection optical system and the surface of the substrate into substantial coincidence with each other, wherein said adjusting system comprises driving means for actuating said holder to cause displacement of the substrate along the optical axis of said projection optical system, and said driving means (i) actuates said holder to start the displacement of the substrate along the optical axis of said projection optical system, during the movement of said holder and before the substrate, being moved by said holder substantially along the focal plane of said projection optical system, is moved up to said predetermined station, and (ii) completes the displacement of the substrate along the optical axis of said projection optical system for substantial coincidence of the surface of the substrate with the focal plane of said projection optical system, during movement of said holder for moving the substrate to said predetermined station.

2. A device according to claim 1, wherein said detecting system detects the position and inclination of the surface of the substrate with respect to the focal plane of said projection optical system.

3. A device according to claim 1, wherein said driving means actuates said holder, after the substrate is moved up to said predetermined station, to start the displacement of the substrate along the optical axis of said projection optical system for substantial coincidence of the surface of the substrate with the focal plane of said projection optical system.

4. A device according to claim 1, wherein said driving means operates to complete the displacement of the substrate along the optical axis of said projection optical system for substantial coincidence of the surface of the substrate with the focal plane of said projection optical system, during movement of said holder for moving the substrate to said predetermined station.

5. A step-and-repeat exposure apparatus with a projection optical system, for placing different portions of a wafer sequentially at a predetermined station, adjacent to a focal plane of said projection optical system, and for projecting a radiation beam to each portion of the wafer, placed at said predetermined station, through said projection optical system to thereby print a pattern on that portion of the wafer, said apparatus comprising:

a wafer stage for holding the wafer and being movable substantially along the focal plane of said projection optical system so as to move each portion of the wafer to said predetermined station, sequentially, wherein said wafer stage displaces the wafer along an optical axis of said projection optical system;

a detecting device for detecting a deviation of a surface of a particular portion of the wafer with respect to the focal plane of said projection optical system, said detecting device being adapted to detect the position of the surface of the particular portion of the wafer during movement of said wafer stage substantially along the focal plane of said projection optical system and before the particular portion of the substrate, being moved by said wafer stage, is moved up to said predetermined station, wherein said detecting device detects the position and inclination of the surface of the particular portion of the wafer with respect to the focal plane of said projection optical system; and an adjusting device for adjusting a positional relationship between the focal plane of said projection optical system and the surface of the particular portion of the substrate on the basis of the detection by said detecting device, so as to bring the focal plane of said projection optical system and the surface of the particular portion of the substrate into substantial coincidence with each other, wherein said adjusting device comprises driving means for actuating said wafer stage to cause displacement of the wafer along the optical axis of said projection optical system, and said driving means (i) actuates said wafer stage to start the displacement of the wafer along the optical axis of said projection optical system, during movement of said wafer stage and before the particular portion of the wafer, being moved by said wafer stage substantially along the focal plane of said projection optical system, is moved up to said predetermined station, and (ii) completes the displacement of the wafer along the optical axis of said projection optical system for substantial coincidence of the surface of the particular portion of the wafer with the focal plane of said projection optical system, during movement of said wafer stage for moving the particular portion of the wafer to said predetermined station.

6. An apparatus according to claim 5, wherein said projection optical system is adapted to project an image of a circuit pattern of an original onto the focal plane.

7. An apparatus according to claim 5, wherein said driving means actuates said wafer stage, after the particular portion of the wafer is moved up to said predetermined station, to start the displacement of the wafer along the optical axis of said projection optical system for substantial coincidence of the surface of the particular portion of the wafer with the focal plane of said projection optical system.

8. An apparatus according to claim 5, wherein said detecting device comprises a sensor for optically detecting level of the surface of the particular portion of the wafer.

9. An apparatus according to claim 8, wherein said detecting device is arranged to optically detect the level of the surface of the particular portion of the wafer as that portion of the wafer, being moved by said wafer stage, is at a position 5-100 microns short of said predetermined station.

10. An apparatus according to claim 8, wherein said detecting device repeats the optical detection for the level of the surface of the particular portion of the wafer before that portion of the wafer is moved up to said predetermined station.

11. In a focusing method wherein a substrate is moved substantially along a focal plane of a projection optical system up to a predetermined station adjacent to the focal plane of the projection optical system and then, at the predetermined station, the surface of the substrate is brought into substantial coincidence with the focal plane of the projection optical system, the improvement comprising the steps of:

detecting a deviation of the surface of the substrate with respect to the focal plane of the projection optical system, before the substrate, being moved substantially along the focal plane of the projection optical system, is moved up to the predetermined station; and substantially correcting the deviation on the basis of the detection, wherein said correcting step is executed during the movement of the substrate to the predetermined station, and is accomplished before the substrate, being moved, is moved up to the predetermined station.

12. A method according to claim 11, wherein, for said substantial correction of the deviation, the substrate is displaced along an optical axis of the projection optical system.

13. A method according to claim 11, wherein, for said substantial correction of the deviation, the focal plane of the projection optical system is shifted along an optical axis of the projection optical system.

14. In a semiconductor device manufacturing method wherein a wafer is moved substantially along a focal plane of a projection optical system to place different portions of the wafer sequentially at a predetermined station, adjacent to the focal plane of the projection optical system, and wherein, at the predetermined station, each portion of the wafer is brought into substantial coincidence with the focal plane of the projection optical system and then a radiation beam is projected to that portion of the wafer through the projection optical system to print a pattern on that portion of the wafer, the improvement comprising the steps of:

detecting a deviation of the surface of a particular portion of the wafer with respect to the focal plane of the projection optical system, before the particular portion of the wafer, being moved substantially along the focal plane of the projection optical system, is moved up to the predetermined station; and substantially correcting the deviation on the basis of the detection, wherein said correcting step is executed during the movement of the particular portion of the wafer to the predetermined station, and is accomplished before the particular portion of the wafer, being moved, is moved up to the predetermined station.

15. A method according to claim 14, wherein, for said substantial correction of the deviation, the wafer is displaced along an optical axis of the projection optical system.

16. A method according to claim 14, wherein, for said substantial correction of the deviation, the focal plane of the projection optical system is shifted along an optical axis of the projection optical system.

17. In a semiconductor device manufacturing method wherein a wafer is moved substantially along a focal plane of a projection optical system to place different portions of the wafer sequentially at a predetermined station, adjacent to the focal plane of the projection optical system, and wherein, at the predetermined station, each portion of the wafer is brought into substantial coincidence with the focal plane of the projection optical system and then a radiation beam is projected to that portion of the wafer through the projection optical system to print a pattern on that portion of the wafer, the improvement comprising the steps of:

detecting a deviation of the surface of a particular portion of the wafer with respect to the focal plane of the projection optical system, before the particular portion of the wafer, being moved, is moved up to the predetermined station; and moving the wafer along an optical axis of the projection optical system in accordance with the detection of the deviation so as to substantially correct the deviation, wherein the substantial correction of the deviation is executed during the movement of the particular portion of the wafer to the predetermined station, and is accomplished before the particular portion of the wafer, being moved, is moved up to the predetermined station.

\* \* \* \* \*